(12) United States Patent
Nagano et al.

(10) Patent No.: US 9,748,428 B2
(45) Date of Patent: *Aug. 29, 2017

(54) LIGHT DETECTION DEVICE INCLUDING A SEMICONDUCTOR LIGHT DETECTION ELEMENT WITH A THROUGH-HOLE ELECTRODE CONNECTION, A MOUNTING SUBSTRATE AND A LIGHT-TRANSMISSIVE SUBSTRATE

(71) Applicant: HAMAMATSU PHOTONICS K.K., Hamamatsu-shi, Shizuoka (JP)

(72) Inventors: Terumasa Nagano, Hamamatsu (JP); Noburo Hosokawa, Hamamatsu (JP); Tomofumi Suzuki, Hamamatsu (JP); Takashi Baba, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/213,629

(22) Filed: Jul. 19, 2016

(65) Prior Publication Data

US 2016/0329455 A1 Nov. 10, 2016

Related U.S. Application Data

(63) Continuation of application No. 14/352,429, filed as application No. PCT/JP2012/069730 on Aug. 2, 2012, now Pat. No. 9,435,686.

(30) Foreign Application Priority Data

Oct. 21, 2011 (JP) ................................. 2011-232106

(51) Int. Cl.
*H01L 27/146* (2006.01)
*H01L 31/107* (2006.01)
(Continued)

(52) U.S. Cl.
CPC ............. *H01L 31/107* (2013.01); *G01J 1/42* (2013.01); *G01T 1/208* (2013.01); *H01L 27/144* (2013.01);
(Continued)

(58) Field of Classification Search
CPC ................. H01L 31/107; H01L 27/146; H01L 31/02027
(Continued)

(56) References Cited

U.S. PATENT DOCUMENTS 8,541,865 B2 9/2013 Yannou et al.
8,860,166 B2 10/2014 Sanfilippo et al.
(Continued)

FOREIGN PATENT DOCUMENTS

CN 1606808 4/2005
CN 1685513 10/2005
(Continued)

OTHER PUBLICATIONS

English-language translation of International Preliminary Report on Patentability (IPRP) dated May 1, 2014 that issued in WO Patent Application No. PCT/JP2012/069730.
(Continued)

*Primary Examiner* — Que T Le
(74) *Attorney, Agent, or Firm* — Drinker Biddle & Reath LLP

(57) ABSTRACT

A semiconductor light detection element includes a plurality of avalanche photodiodes operating in Geiger mode and formed in a semiconductor substrate, quenching resistors connected in series to the respective avalanche photodiodes and arranged on a first principal surface side of the semiconductor substrate, and a plurality of through-hole electrodes electrically connected to the quenching resistors and formed so as to penetrate the semiconductor substrate from the first principal surface side to a second principal surface (Continued)

side. A mounting substrate includes a plurality of electrodes arranged corresponding to the respective through-hole electrodes on a third principal surface side. The through-hole electrodes and the electrodes are electrically connected through bump electrodes, and a side surface of the semiconductor substrate and a side surface of a glass substrate are flush with each other.

6 Claims, 14 Drawing Sheets

(51) Int. Cl.
    *H01L 27/144* (2006.01)
    *G01T 1/208* (2006.01)
    *H01L 31/0224* (2006.01)
    *G01J 1/42* (2006.01)
    *H01L 49/02* (2006.01)
    *H01L 31/02* (2006.01)

(52) U.S. Cl.
    CPC .... *H01L 27/1443* (2013.01); *H01L 27/14636* (2013.01); *H01L 27/14643* (2013.01); *H01L 27/14658* (2013.01); *H01L 27/14663* (2013.01); *H01L 28/20* (2013.01); *H01L 31/02005* (2013.01); *H01L 31/022408* (2013.01)

(58) Field of Classification Search
    USPC .................................. 250/208.1, 214 R, 239
    See application file for complete search history.

(56) References Cited

U.S. PATENT DOCUMENTS

| | | | |
|---|---|---|---|
| 8,969,990 B2 | | 3/2015 | Nagano et al. |
| 9,184,190 B2 * | | 11/2015 | Sato .................... H01L 27/1446 |
| 9,368,528 B2 * | | 6/2016 | Nagano ................ H01L 31/107 |
| 9,425,224 B2 * | | 8/2016 | Nagano ................ H01L 27/1446 |
| 9,435,686 B2 * | | 9/2016 | Nagano ................ H01L 27/144 |
| 2007/0158708 A1 | | 7/2007 | Shibayama |
| 2010/0109114 A1 | | 5/2010 | Izumi |
| 2011/0147567 A1 | | 6/2011 | Grazioso et al. |
| 2013/0270666 A1 | | 10/2013 | Sato et al. |

FOREIGN PATENT DOCUMENTS

| | | |
|---|---|---|
| CN | 1759485 | 4/2006 |
| CN | 101163988 | 4/2008 |
| CN | 101192620 | 6/2008 |
| CN | 101258577 | 9/2008 |
| CN | 101379615 | 3/2009 |
| CN | 101484999 | 7/2009 |
| CN | 101866897 | 10/2010 |
| CN | 101488506 | 2/2011 |
| JP | 2001-291853 A | 10/2001 |
| JP | 2001-318155 A | 11/2001 |
| JP | 2004-057507 | 2/2004 |
| JP | 2004-165602 A | 6/2004 |
| JP | 2005-303258 | 10/2005 |
| JP | 2006-128172 | 5/2006 |
| JP | 2007-123679 | 5/2007 |
| JP | 2008-542706 | 11/2008 |
| JP | 2010-114199 A | 5/2010 |
| JP | 2010-535409 | 11/2010 |
| JP | 2010-536186 | 11/2010 |
| JP | 2011-003739 A | 1/2011 |
| JP | 2011-007693 | 1/2011 |
| JP | 5791461 | 10/2015 |
| TW | 200822354 | 5/2008 |
| TW | 201044619 | 12/2010 |
| TW | 201117406 | 5/2011 |
| WO | WO 2004/019411 A1 | 3/2004 |
| WO | WO 2006/126027 | 11/2006 |
| WO | WO 2008/004547 A1 | 1/2008 |
| WO | WO 2010/035379 | 4/2010 |

OTHER PUBLICATIONS

English-language translation of International Preliminary Report on Patentability (IPRP) dated May 22, 2014 that issued in WO Patent Application No. PCT/JP/2012/069728.

U.S. Office Action dated Sep. 18, 2015 that issued U.S. Appl. No. 14/350,647 including Double Patenting Rejections on pp. 2-5.

U.S. Office Action dated Apr. 14, 2016 that issued in U.S. Appl. No. 14/605,120 including Double Patenting Rejections on pp. 2-4.

Stern, A.G., et al., "Design of a back-illuminated, crystallographically etched, silicon-on-sapphire avalanche photodiode with monolithically integrated microlens, for dual-mode passive & active imaging arrays," Lidar Remote Sensing for Environmental Monitoring IX, vol. 7153, Dec. 31, 2008, pp. 71530Z-1-71530Z-13.

U.S. Office Action dated Apr. 5, 2017 that issued in U.S. Appl. No. 15/002,706 including Double Patenting Rejections on pp. 2-6.

U.S. Office Action dated Apr. 12, 2017 that issued in U.S. Appl. No. 15/150,859 including Double Patenting Rejections on pp. 2-6.

* cited by examiner

LIGHT DETECTION DEVICE INCLUDING A SEMICONDUCTOR LIGHT DETECTION ELEMENT WITH A THROUGH-HOLE ELECTRODE CONNECTION, A MOUNTING SUBSTRATE AND A LIGHT-TRANSMISSIVE SUBSTRATE

This is a continuation application of copending application Ser. No. 14/352,429, having a §371 date of Apr. 17, 2014, which is a national stage filing based on PCT International Application No. PCT/JP2012/069730, filed on Aug. 2, 2012. The copending application Ser. No. 14/352,429 is incorporated by reference herein in its entirety.

TECHNICAL FIELD

The present invention relates to a light detection device.

BACKGROUND ART

There is a known photodiode array (semiconductor light detection element) having a plurality of avalanche photodiodes operating in Geiger mode, quenching resistors connected in series to the respective avalanche photodiodes, and signal lines to which the quenching resistors are connected in parallel (e.g., cf. Patent Literature 1). In this photodiode array, when an avalanche photodiode forming a pixel detects a photon to induce Geiger discharge, a pulsed signal is obtained by action of the quenching resistor connected to the avalanche photodiode. Each avalanche photodiode counts a photon. For this reason, with incidence of multiple photons at the same timing, we can also find out the number of incident photons in accordance with an output charge amount or signal intensity of all output pulses.

CITATION LIST

Patent Literature

Patent Literature 1: Japanese Patent Application Laid-Open Publication No. 2011-003739

SUMMARY OF INVENTION

Technical Problem

In the above-described semiconductor light detection element, the quenching resistors are connected in parallel to the signal lines, and for this reason, the avalanche photodiodes are also connected in parallel to each other. In the case of the semiconductor light detection element having the plurality of avalanche photodiodes connected in parallel, distances of interconnections (signal lines) for guiding signals output from the respective avalanche photodiodes (which will be referred to hereinafter as "interconnection distances") can be different among pixels (avalanche photodiodes). The different interconnection distances among pixels lead to different temporal resolutions among pixels due to influence of resistances and capacitances of the interconnections.

It is an object of the present invention to provide a light detection device capable of achieving further improvement in temporal resolution, while suppressing the difference of temporal resolutions among pixels.

Solution to Problem

The present invention provides a light detection device comprising: a semiconductor light detection element having a semiconductor substrate including first and second principal surfaces opposed to each other; a mounting substrate arranged as opposed to the semiconductor light detection element and having a third principal surface opposed to the second principal surface of the semiconductor substrate; and a glass substrate arranged as opposed to the semiconductor light detection element and having a fourth principal surface opposed to the first principal surface of the semiconductor substrate, wherein the semiconductor light detection element includes a plurality of avalanche photodiodes operating in Geiger mode and formed in the semiconductor substrate, quenching resistors connected in series to the respective avalanche photodiodes and arranged on the first principal surface side of the semiconductor substrate, and a plurality of through-hole electrodes electrically connected to the quenching resistors and formed so as to penetrate the semiconductor substrate from the first principal surface side to the second principal surface side, wherein the mounting substrate includes a plurality of first electrodes arranged corresponding to the respective through-hole electrodes on the third principal surface side, and a signal processing unit electrically connected to the plurality of first electrodes and configured to process output signals from the respective avalanche photodiodes, wherein the through-hole electrodes and the first electrodes are electrically connected through bump electrodes, and wherein a side surface of the semiconductor substrate and a side surface of the glass substrate are flush with each other.

In the present invention, the plurality of through-hole electrodes electrically connected to the quenching resistors and penetrating the semiconductor substrate from the first principal surface side to the second principal surface side are formed in the semiconductor substrate of the semiconductor light detection element, and the through-hole electrodes of the semiconductor light detection element and the first electrodes of the mounting substrate are electrically connected through the bump electrodes. This configuration allows the interconnection distances of the respective pixels to be set extremely short and thus allows values thereof to be equalized without significant variation. Therefore, it remarkably suppresses the influence of resistances and capacitances of the interconnections and thus achieves further improvement in temporal resolution.

In the present invention, the glass substrate arranged as opposed to the semiconductor light detection element enhances the mechanical strength of the semiconductor substrate. Since the side surface of the semiconductor substrate and the side surface of the glass substrate are flush with each other, dead space is reduced.

In the present invention, a principal surface of the glass substrate opposed to the fourth principal surface may be flat. In this case, it is extremely easy to perform installation of a scintillator onto the glass substrate.

In the present invention, the through-hole electrodes may be located in regions among the avalanche photodiodes. In this case, it is feasible to prevent reduction in fill factor in each pixel.

In the present invention, the semiconductor light detection element may further include second electrodes electrically connected to the corresponding through-hole electrodes and arranged on the second principal surface side of the semiconductor substrate, and the first electrodes and the second electrodes may be connected through the bump electrodes. In this case, it is feasible to certainly implement connection between the first electrodes and the second electrodes through the bump electrodes.

In the present invention, each avalanche photodiode may have: the semiconductor substrate of a first conductivity type a first semiconductor region of a second conductivity type formed on the first principal surface side of the semiconductor substrate; a second semiconductor region of the second conductivity type formed in the first semiconductor region and having a higher impurity concentration than the first semiconductor region; and a third electrode arranged on the first principal surface side of the semiconductor substrate and electrically connecting the second semiconductor region and the quenching resistor, and the second electrode may be formed on a region corresponding to the second semiconductor region on the second principal surface. In this case, it is feasible to set the size of the second electrode relatively large. This configuration allows us to more certainly implement the connection between the first electrodes and the second electrodes through the bump electrodes and to enhance the mechanical strength of the connection.

In the present invention, a plurality of quenching resistors may be electrically connected to the through-hole electrode. In this case, the through-hole electrode is shared among pixels, which reduces the number of through-hole electrodes formed in the semiconductor substrate. This configuration suppresses reduction in mechanical strength of the semiconductor substrate.

In the present invention, interconnection distances from the respective avalanche photodiodes through the corresponding quenching resistors to the through-hole electrode may be equal. In this case, reduction in temporal resolution is prevented even in the configuration wherein the through-hole electrode is shared among pixels.

Advantageous Effect of Invention

The present invention provides the light detection device capable of achieving further improvement in temporal resolution, while suppressing the difference of temporal resolutions among pixels.

DESCRIPTION OF EMBODIMENTS

The preferred embodiments of the present invention will be described below in detail with reference to the accompanying drawings. In the description the same elements or elements with the same functionality will be denoted by the same reference signs, without redundant description.

Figure 1:
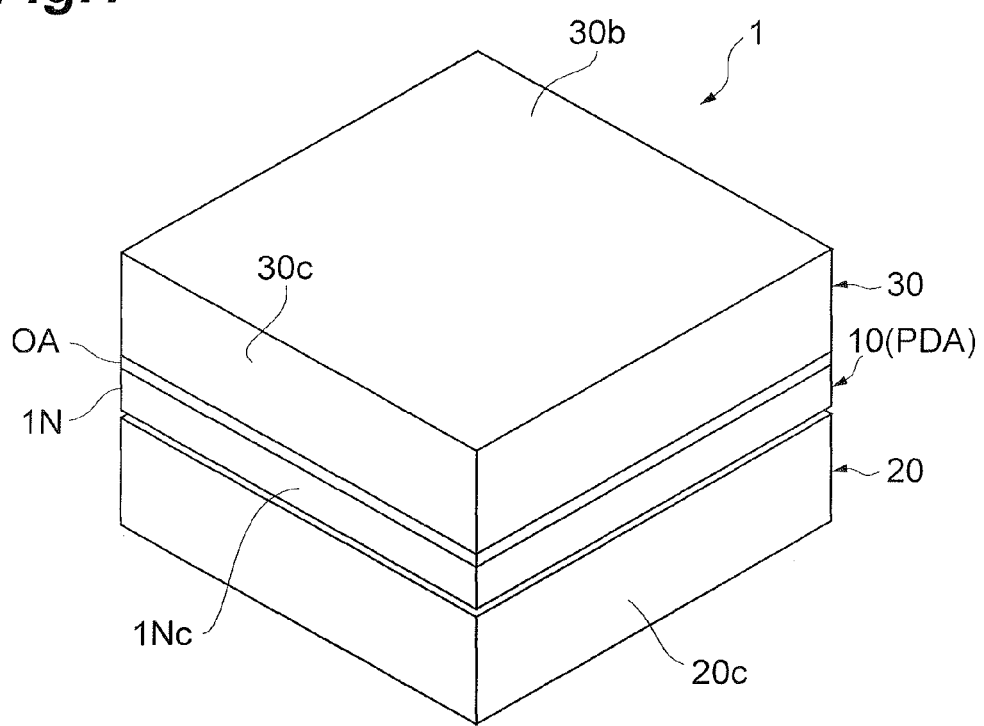
FIG. 1 is a schematic perspective view showing a light detection device according to an embodiment of the present invention.
Figure 2:
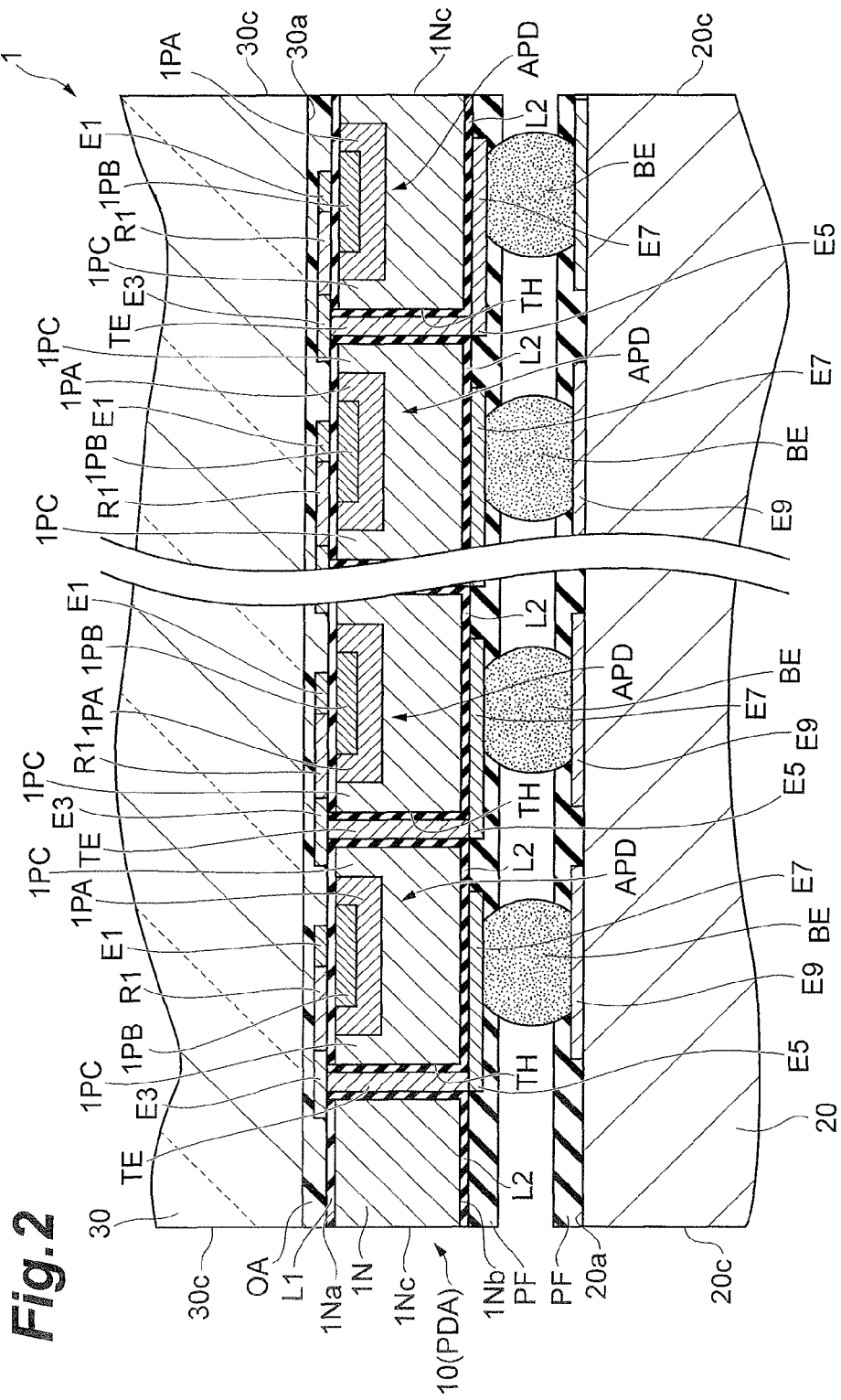
FIG. 2 is a drawing for explaining a sectional configuration of the light detection device according to the present embodiment.
Figure 3:
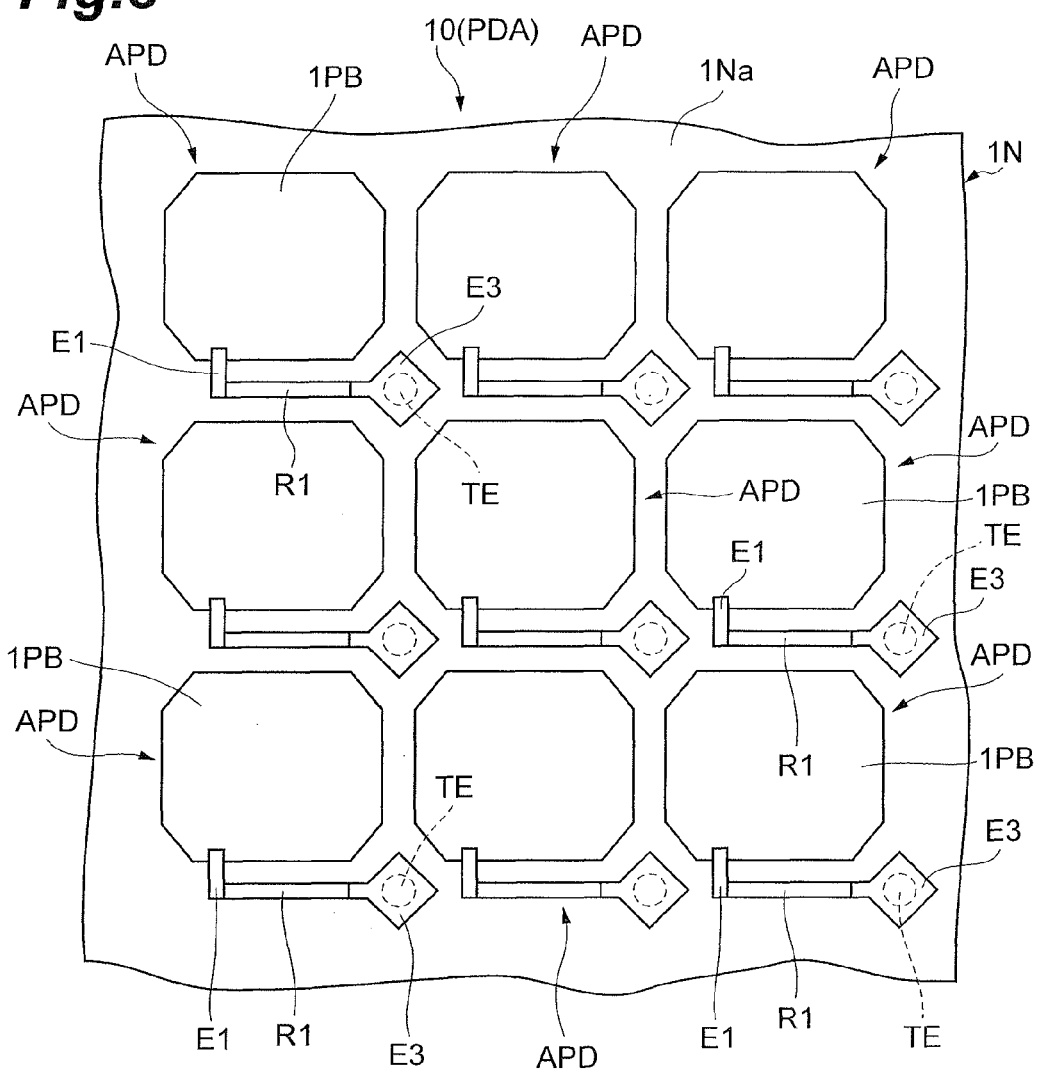
FIG. 3 is a schematic plan view of a semiconductor light detection element.
Figure 4:
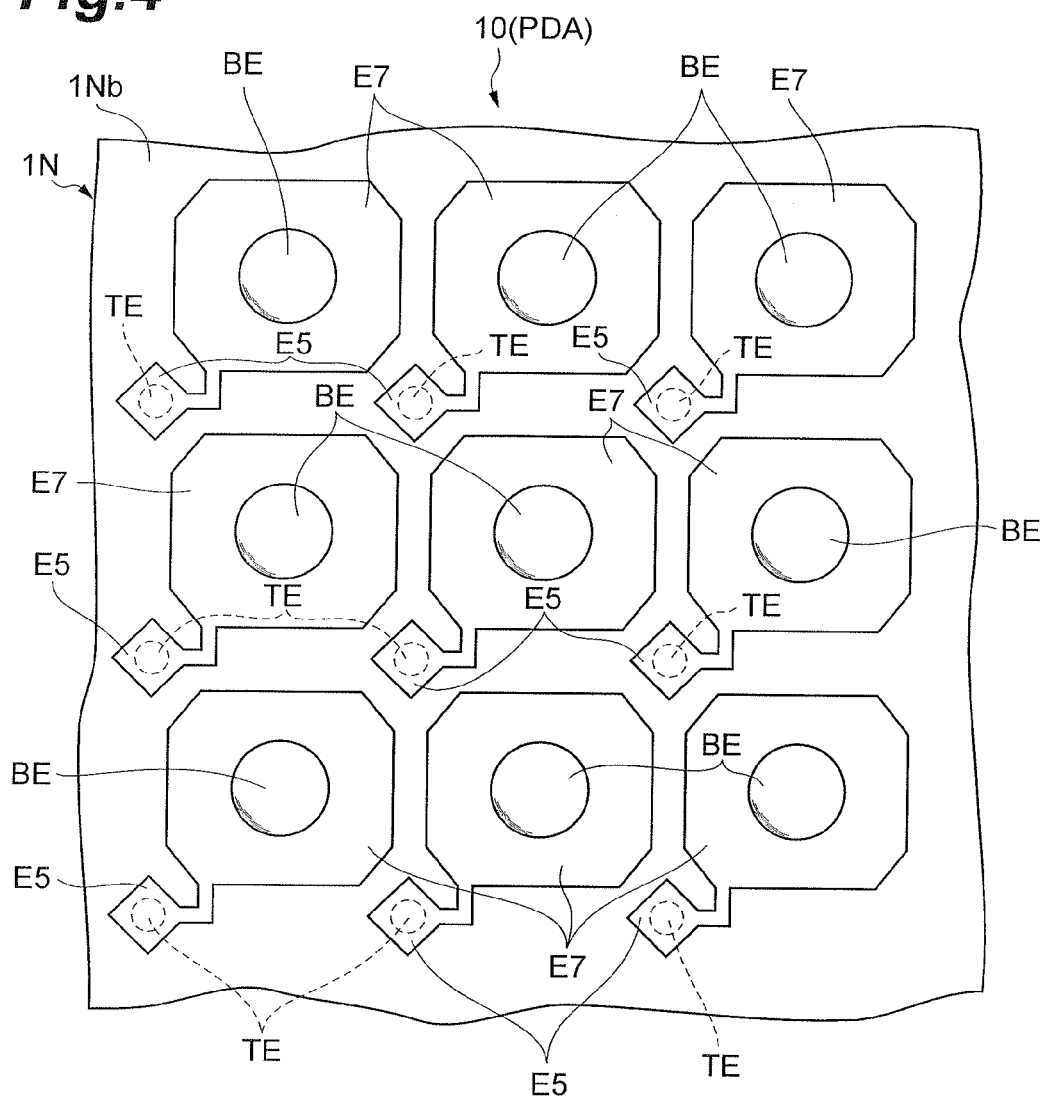
FIG. 4 is a schematic plan view of the semiconductor light detection element.
Figure 5:
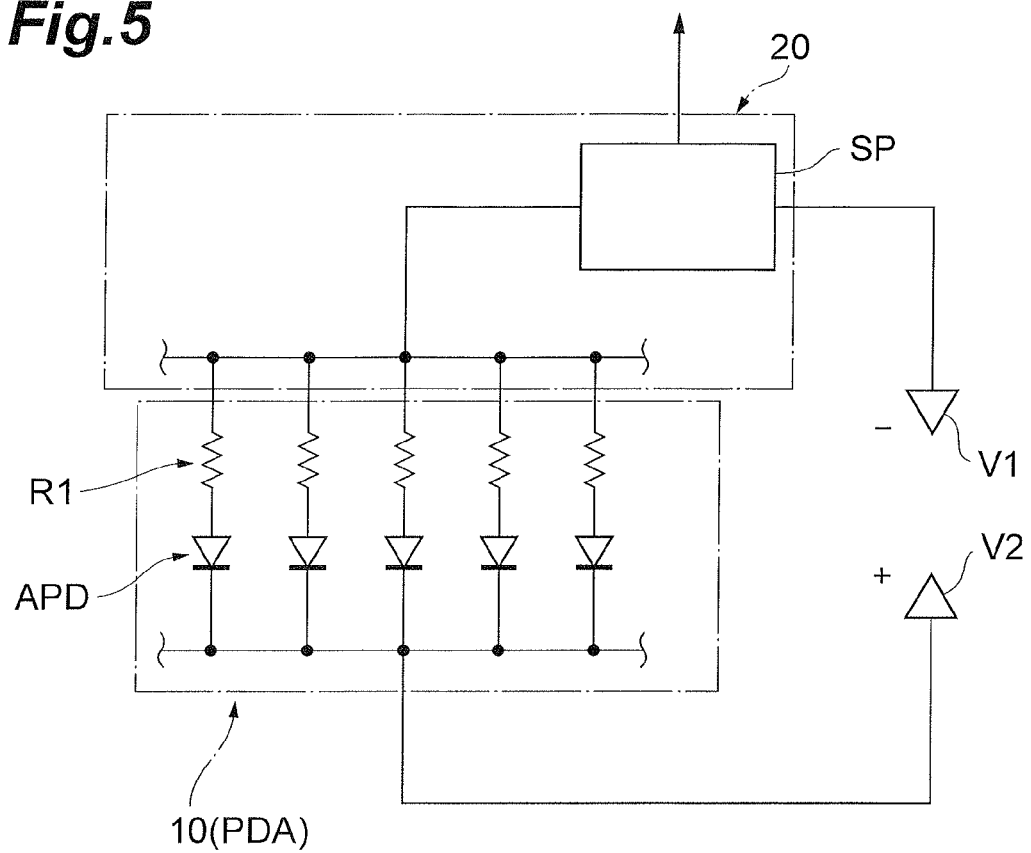
FIG. 5 is a circuit diagram of the light detection device.
Figure 6:
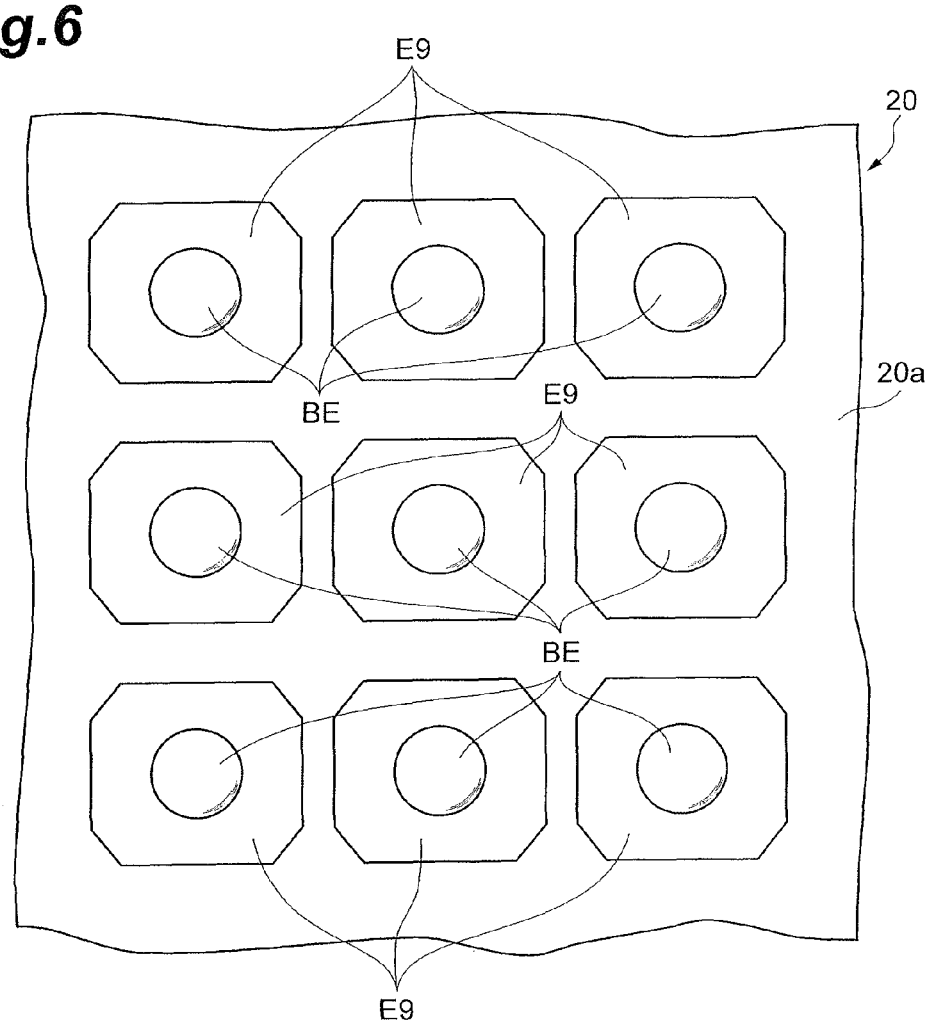
FIG. 6 is a schematic plan view of a mounting substrate.

A configuration of the light detection device 1 according to the present embodiment will be described with reference to FIGS. 1 to 6. FIG. 1 is a schematic perspective view showing the light detection device according to the present embodiment. FIG. 2 is a drawing for explaining a sectional configuration of the light detection device according to the present embodiment. FIGS. 3 and 4 are schematic plan views of a semiconductor light detection element. FIG. 5 is a circuit diagram of the light detection device. FIG. 6 is a schematic plan view of a mounting substrate.

The light detection device 1, as shown in FIGS. 1 and 2, has a semiconductor light detection element 10, a mounting substrate 20, and a glass substrate 30. The mounting substrate 20 is arranged as opposed to the semiconductor light detection element 10. The glass substrate 30 is arranged as opposed to the semiconductor light detection element 10. The semiconductor light detection element 10 is arranged between the mounting substrate 20 and the glass substrate 30.

The semiconductor light detection element 10 consists of a photodiode array PDA. The photodiode array PDA has a semiconductor substrate 1N of a rectangular shape on the plan view. The semiconductor substrate 1N includes a principal surface 1Na and a principal surface 1Nb opposed to each other. The semiconductor substrate 1N is an N-type (first conductivity type) semiconductor substrate comprised of Si.

The photodiode array PDA includes a plurality of avalanche photodiodes APD formed in the semiconductor substrate 1N. Connected in series to each avalanche photodiode APD, as also shown in FIG. 3, is a quenching resistor R1. One avalanche photodiode APD constitutes one pixel in the photodiode array PDA. While each avalanche photodiode APD is connected in series to the corresponding quenching resistor R1, all the avalanche photodiodes are connected in parallel and a reverse bias voltage is applied thereto from a power supply. Output currents from the avalanche photodiodes APD are detected by a below-described signal processing unit SP. FIG. 3 is drawn without illustration of an insulating layer L1 shown in FIG. 2, for clarity of structure.

Each individual avalanche photodiode APD has a P-type (second conductivity type) first semiconductor region 1PA and a P-type (second conductivity type) second semiconductor region 1PB. The first semiconductor region 1PA is formed on the principal surface 1Na side of the semiconductor substrate 1N. The second semiconductor region 1 PB is formed in the first semiconductor region 1 PA and has a higher impurity concentration than the first semiconductor region 1PA. The planar shape of the second semiconductor region 1PB is, for example; a polygonal shape (octagon in the present embodiment). The depth of the first semiconductor region 1PA is larger than that of the second semiconductor region 1PB.

The semiconductor substrate 1N has N-type (first conductivity type) semiconductor regions 1PC. The semiconductor regions 1PC are formed on the principal surface 1 Na side of the semiconductor substrate 1N. The semiconductor regions 1PC prevent PN junctions formed between the N-type semiconductor substrate 1N and the P-type first semiconductor regions 1PA from being exposed to through holes TH in which below-described through-hole electrodes TE are arranged. The semiconductor regions 1PC are formed at positions corresponding to the through holes TH (through-hole electrodes TE).

Each avalanche photodiode APD, as shown in FIG. 3, has an electrode E1 and an electrode E3. The electrode E1 and electrode E3 are arranged each on the principal surface 1Na side of the semiconductor substrate 1N. The electrode E1 is electrically connected to the second semiconductor region 1PB. The electrode E3 is arranged through the insulating layer L1 on the semiconductor substrate 1N outside the second semiconductor region 1PB, when viewed from the principal surface 1Na side. The first semiconductor region 1PA is electrically connected through the second semiconductor region 1PB to the electrode E1.

The avalanche photodiode APD, as also shown in FIG. 4, has an electrode (not shown) electrically connected to the semiconductor substrate 1N, an electrode E5, and an electrode E7 connected to the electrode E5, each of which is arranged on the principal surface 1Nb side of the semiconductor substrate 1N. The electrode E5 is arranged through an insulating layer L2 on the semiconductor substrate 1N outside the second semiconductor region 1PB, when viewed from the principal surface 1Nb side. The electrode E7 is arranged through the insulating layer L2 on the semiconductor substrate 1N overlapping with the second semiconductor region 1PB, when viewed from the principal surface 1Nb side. The electrode E7 is arranged on a region corresponding to the second semiconductor region 1PB on the principal surface 1Nb side. FIG. 4 is drawn without illustration of a passivation film PF shown in FIG. 2, for clarity of structure.

The photodiode array PDA has the quenching resistors R1 for the respective individual avalanche photodiodes APD. Each quenching resistor R1 is arranged through the insulating layer L1 on the semiconductor substrate 1N outside the second semiconductor region 1PB. The quenching resistor R1 is arranged on the principal surface 1Na side of the semiconductor substrate 1N. The quenching resistor R1 has one end connected to the electrode E1 and the other end connected to the electrode E3.

The photodiode array PDA includes a plurality of through-hole electrodes TE. The through-hole electrodes TE are provided for the respective individual avalanche photodiodes APD. The through-hole electrodes TE are formed so as to penetrate the semiconductor substrate 1N from the principal surface 1Na side to the principal surface 1Nb side. The through-hole electrodes TE are arranged in the through holes TH penetrating the semiconductor substrate 1N. The insulating layer L2 is also formed in the through holes TH. Therefore, the through-hole electrodes TE are arranged through the insulating layer L2 in the through holes TH.

The through-hole electrode TE has one end connected to the electrode E3 and the other end connected to the electrode E5. The quenching resistor R1 is electrically connected through the electrode E3, the through-hole electrode TE, and the electrode E5 to the electrode E7.

The through-hole electrode TE is arranged in a region among avalanche photodiodes APD on the plan view. In the present embodiment, the avalanche photodiodes APD are two-dimensionally arrayed in a matrix of M rows in a first direction and N columns in a second direction perpendicular to the first direction (M and N are natural numbers). The through-hole electrode TE is formed in the region surrounded by four avalanche photodiodes APD. Since the through-hole electrodes TE are provided for the respective avalanche photodiodes APD, they are two-dimensionally arrayed in the matrix of M rows in the first direction and N columns in the second direction.

The quenching resistors R1 have the resistivity higher than that of the electrodes E1 to which the quenching resistors R1 are connected. The quenching resistors R1 are comprised, for example, of polysilicon. An applicable method for forming the quenching resistors R1 is a CVD (Chemical Vapor Deposition) process.

The electrodes E1, E3, E5, E7 and the through-hole electrodes TE are comprised of metal such as aluminum. When the semiconductor substrate is made of Si, a frequently used electrode material is AuGe/Ni, as well as aluminum. Although it depends on process design, the electrodes E5, electrodes E7, and through-hole electrodes TE can be integrally formed. An applicable method for forming the electrodes E1, E3, E5, E7 and the through-hole electrodes TE is a sputtering process.

A P-type impurity to be used in the case using Si is a group 3 element such as B and an N-type impurity to be used in the same case is a group 5 element such as N, P, or As. If the semiconductor light detection element is constructed by interchanging the N type and P type of semiconductor conductivity types with each other, the element can also function well. An applicable method for adding these impurities is a diffusion process or an ion implantation process.

A material available for the insulating layers L1, L2 is $SiO_2$ or SiN. An applicable method for forming the insulating layers L1, L2 in the case of the insulating layers L1, L2 being made of $SiO_2$ is a thermal oxidation process or a sputtering process.

In the case of the above-described structure, the PN junctions are formed between the N-type semiconductor substrate 1N and the P-type first semiconductor regions 1PA, thereby forming the avalanche photodiodes APD. The semiconductor substrate 1N is electrically connected to the electrode (not shown) formed on the back surface of the substrate 1N and the first semiconductor regions 1PA are connected through the second semiconductor regions 1PB to the electrodes E1. The quenching resistor R1 is connected in series to the avalanche photodiode APD (cf. FIG. 5).

In the photodiode array PDA, the individual avalanche photodiodes APD are made to operate in Geiger mode. In Geiger mode, a backward voltage (reverse bias voltage) larger than the breakdown voltage of the avalanche photodiodes APD is applied between anodes and cathodes of the avalanche photodiodes APD. A (−) potential V1 is applied to the anodes and a (+) potential V2 to the cathodes. The polarities of these potentials are relative ones, one of which can be the ground potential.

The anodes are the P-type first semiconductor regions 1PA while the cathodes are the N-type semiconductor substrate 1N. When light (photon) is incident into the avalanche photodiode APD, photoelectric conversion is effected inside the substrate to generate photoelectrons. Avalanche multiplication is effected in a region around the PN junction interface of the first semiconductor region 1PA and a group of multiplied electrons flow toward the electrode formed on the back surface of the semiconductor substrate 1N. Namely, with incidence of light (photon) into one pixel (avalanche photodiode APD) in the semiconductor light detection element 10 (photodiode array PDA), it is subjected to multiplication to be taken out as signal from the electrode E7.

Figure 13:
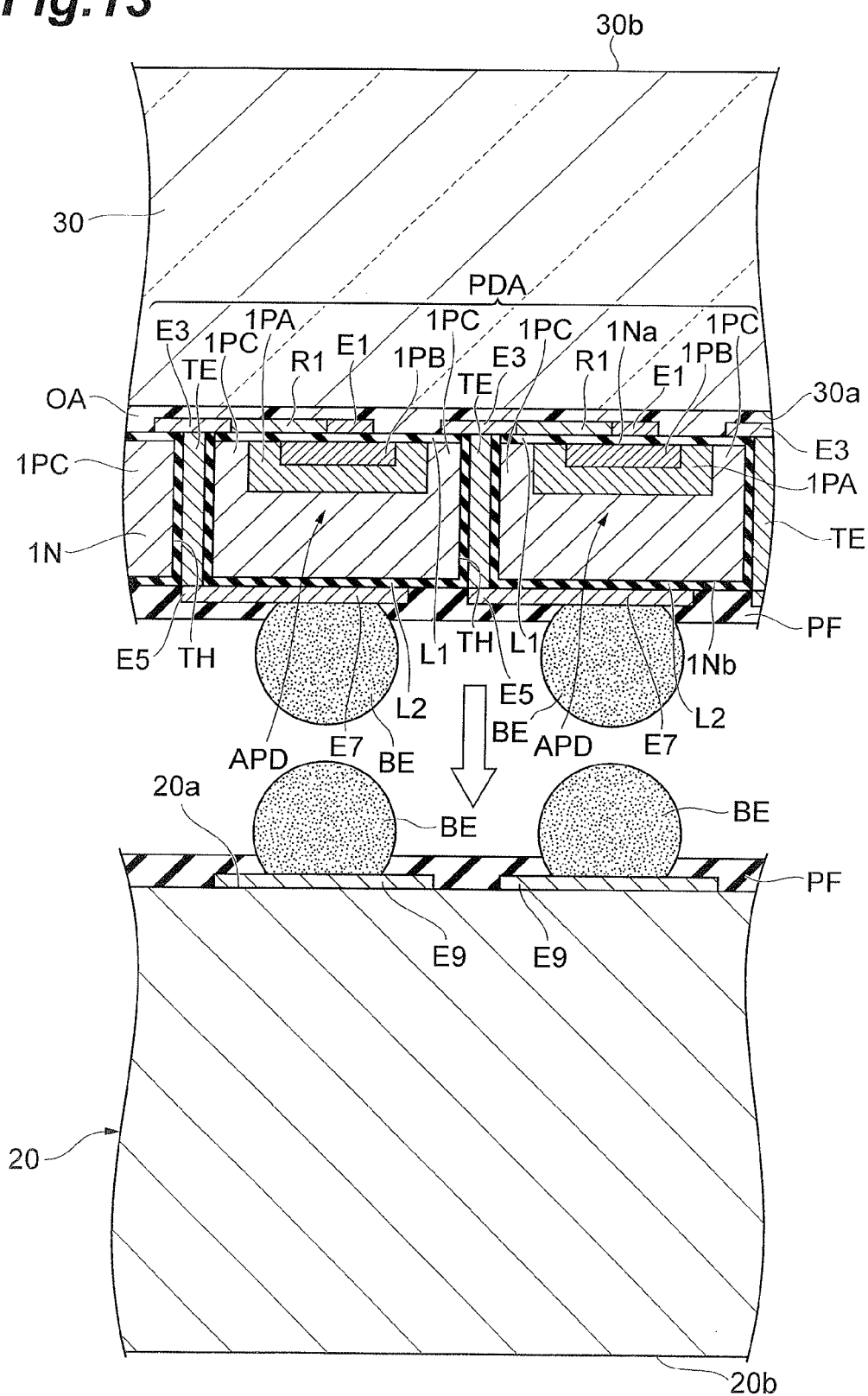
FIG. 13 is a drawing for explaining the manufacturing process of the light detection device according to the present embodiment.

The mounting substrate 20, as also shown in FIGS. 2 and 13, has a principal surface 20a and a principal surface 20b opposed to each other. The mounting substrate 20 has a rectangular shape on the plan view. The principal surface 20a is opposed to the principal surface 1Nb of the semiconductor substrate 1N. The mounting substrate 20 includes a plurality of electrodes E9 arranged on the principal surface 20a side. The electrodes E9 are arranged corresponding to the through-hole electrodes TE, as shown in FIG. 2. Specifically, the electrodes E9 are arranged on respective regions opposed to the electrodes E7, on the principal surface 20a.

The side surfaces 1Nc of the semiconductor substrate 1N and the side surfaces 20c of the mounting substrate 20 are flush with each other, as shown in FIGS. 1 and 2. On the plan view, the outer edge of the semiconductor substrate 1N and the outer edge of the mounting substrate 20 are coincident.

The electrodes E7 and the electrodes E9 are connected through bump electrodes BE. This makes the through-hole electrodes TE electrically connected through the electrodes E5, the electrodes E7, and the bump electrodes BE to the electrodes E9. Then, the quenching resistors R1 are electrically connected to the electrodes E9 through the electrodes E3, through-hole electrodes TE, electrodes E5, electrodes E7, and bump electrodes BE. The electrodes E9 are also comprised of metal such as aluminum as the electrodes E1, E3, E5, E7 and the through-hole electrodes TE are. The electrode material to be used may be, for example, AuGe/Ni, as well as aluminum. The bump electrodes BE are comprised, for example, of solder.

The mounting substrate 20 has a signal processing unit SP, as also shown in FIG. 5. The mounting substrate 20 constitutes ASIC (Application Specific Integrated Circuit). Each electrode E9 is electrically connected to the signal processing unit SP through an interconnection (not shown) formed in the mounting substrate 20. The output signals from the respective avalanche photodiodes APD (semiconductor light detection element 10) are fed to the signal processing unit SP and then the signal processing unit SP processes the output signals from the respective avalanche photodiodes APD. The signal processing unit SP includes a CMOS circuit to convert the output signals from the respective avalanche photodiodes APD into digital pulses. The mounting substrate 20 is configured so as to include a circuit for recording time information, corresponding to each pixel (avalanche photodiode APD). The circuit to be used herein for recording time information is a time-to-digital converter (TDC: Time to Digital Convertor), or, a time voltage converter (TAC: Time to Amplitude Convertor), or the like. Because of this configuration, the difference of interconnection distances in the mounting substrate 20 does not affect the temporal resolution.

Passivation films PF with openings formed at the positions corresponding to the bump electrodes BE are arranged on the principal surface 1Nb side of the semiconductor substrate 1N and on the principal surface 20a side of the mounting substrate 20. The passivation films PF are comprised, for example, of SiN. An applicable method for forming the passivation films PF is a CVD process.

The glass substrate 30 has a principal surface 30a and a principal surface 30b opposed to each other. The glass substrate 30 has a rectangular shape on the plan view. The principal surface 30a is opposed to the principal surface 1Nb of the semiconductor substrate 1N. The principal surface 30b is flat. In the present embodiment, the principal surface 30a is also flat. The glass substrate 30 and the semiconductor light detection element 10 are optically connected to each other with an optical adhesive OA. The glass substrate 30 may be directly formed on the semiconductor light detection element 10.

Although illustration is omitted, a scintillator is optically connected to the principal surface 30b of the glass substrate 30 with an optical adhesive. Scintillation light from the scintillator passes through the glass substrate 30 to enter the semiconductor light detection element 10.

The side surfaces 1Nc of the semiconductor substrate 1N and the side surfaces 30c of the glass substrate 30 are flush with each other, as also shown in FIG. 1. On the plan view, the outer edge of the semiconductor substrate 1N and the outer edge of the glass substrate 30 are coincident.

Next, a manufacturing process of the above-described light detection device 1 will be described with reference to FIGS. 7 to 13. FIGS. 7 to 13 are drawings for explaining the manufacturing process of the light detection device according to the present embodiment.

Figure 7:
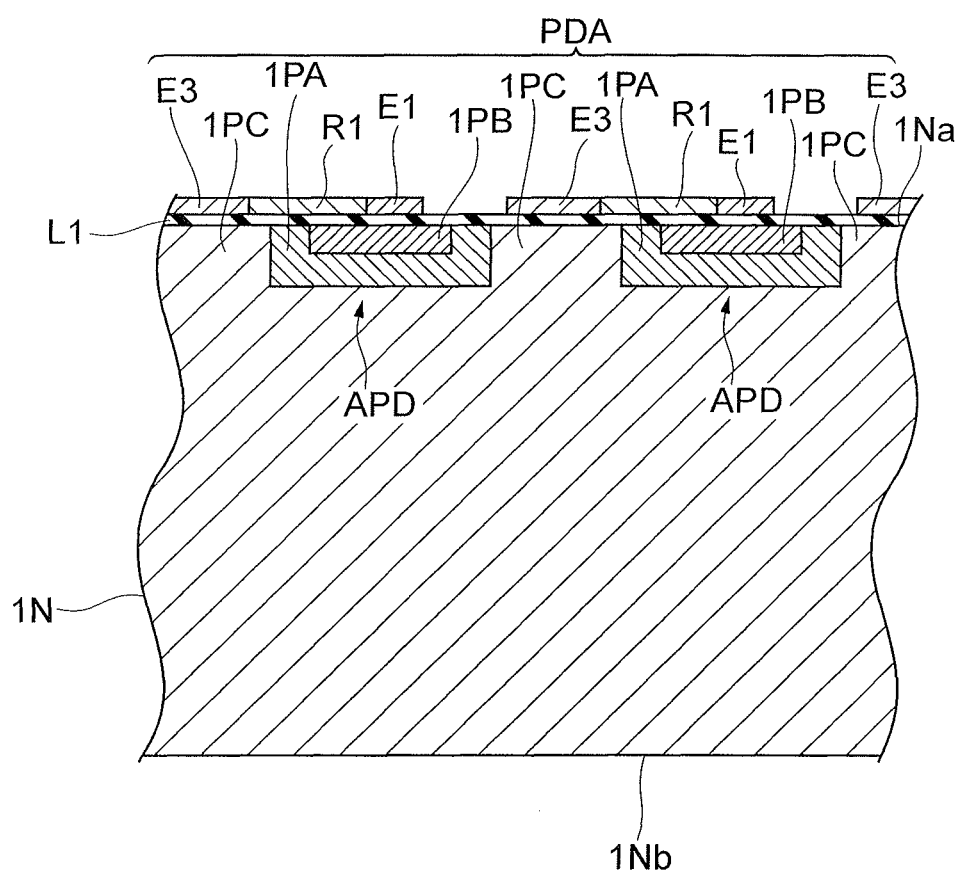
FIG. 7 is a drawing for explaining a manufacturing process of the light detection device according to the present embodiment.

First, the semiconductor substrate 1N in which the portions corresponding to the photodiode array PDA (first semiconductor regions 1PA, second semiconductor regions 1PB, insulating layer L1, quenching resistors R1, electrodes E1, and electrodes E3) are formed is prepared (cf. FIG. 7). The semiconductor substrate 1N is prepared in the form of a semiconductor wafer wherein there are a plurality of portions corresponding to photodiode arrays PDA formed.

Figure 8:
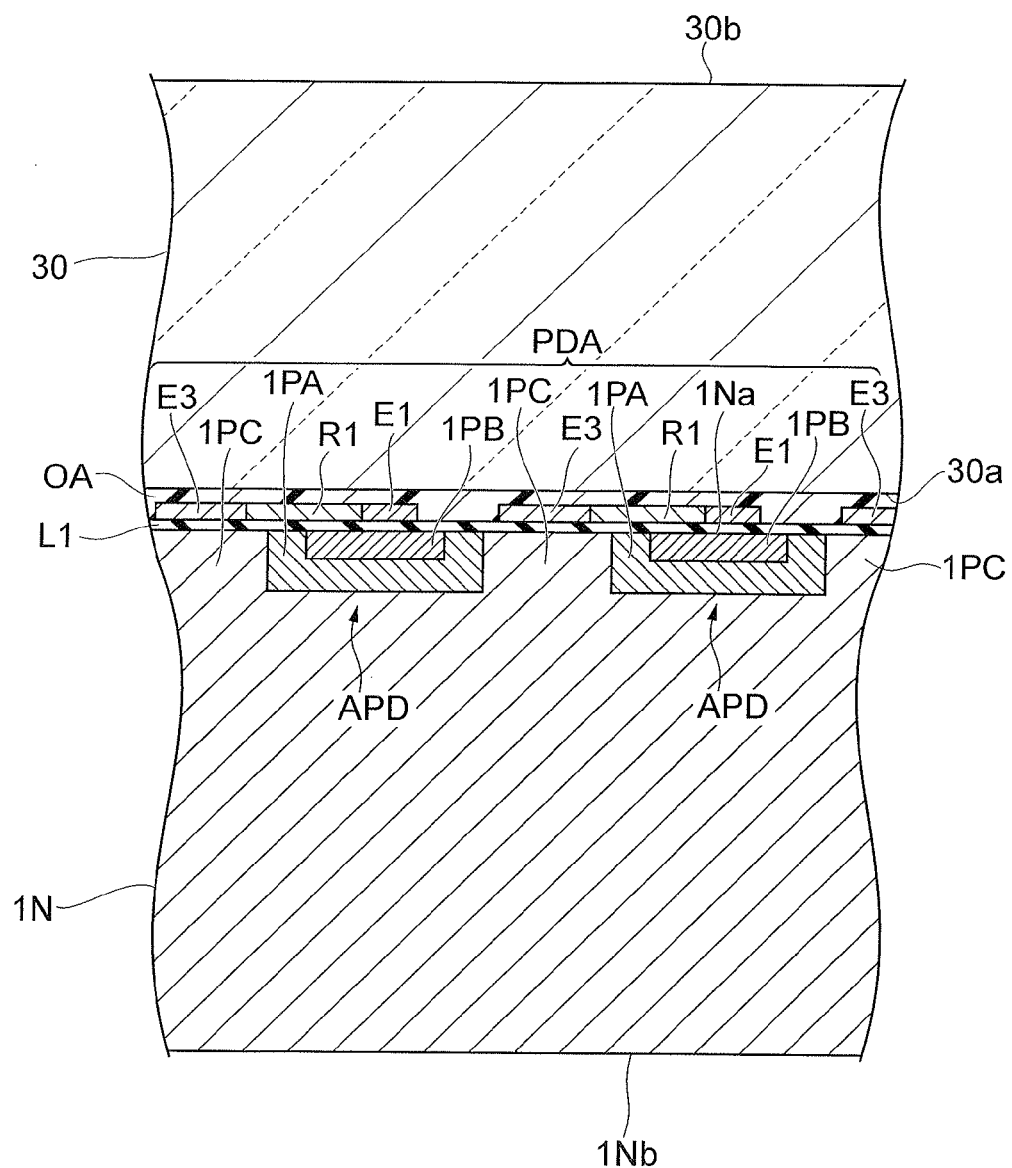
FIG. 8 is a drawing for explaining the manufacturing process of the light detection device according to the present embodiment.

Next, the glass substrate 30 is bonded to the prepared semiconductor substrate 1N through the optical adhesive OA (cf. FIG. 8). This process results in optically connecting the glass substrate 30 and the semiconductor light detection element 10 to each other. The glass substrate 30 is also prepared in the form of a glass substrate preform including a plurality of glass substrates 30 as the semiconductor substrate 1N is.

Figure 9:
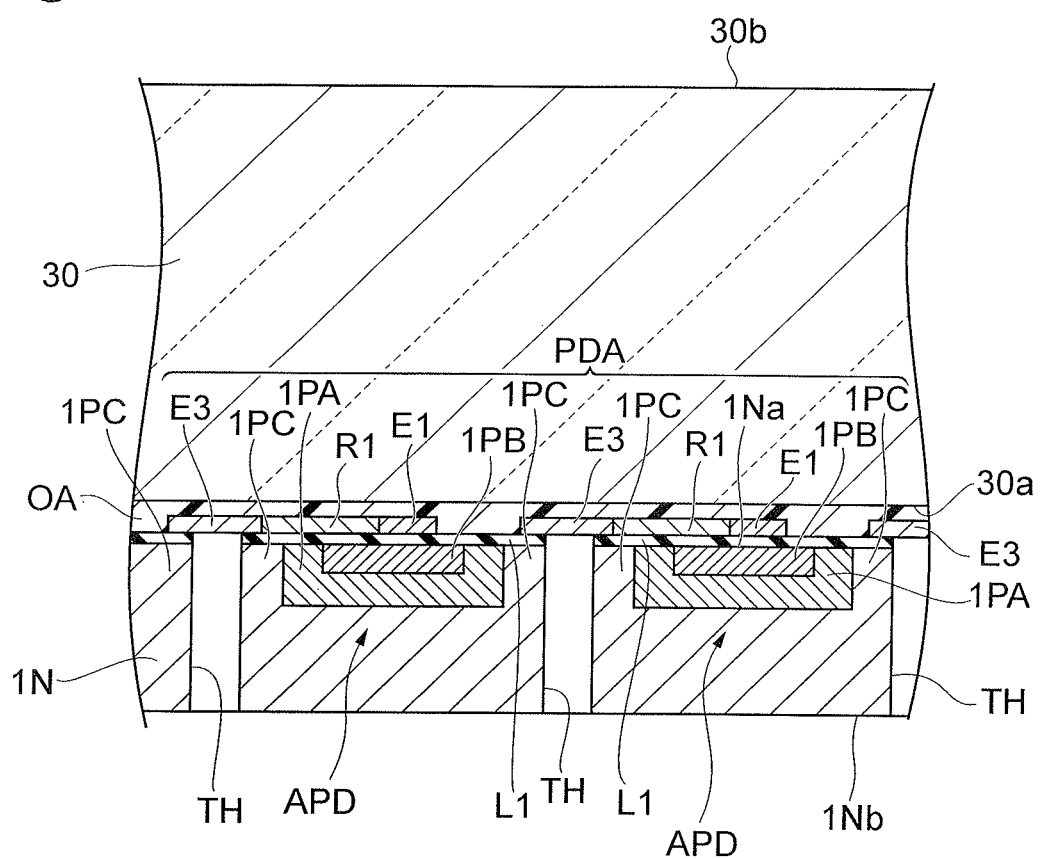
FIG. 9 is a drawing for explaining the manufacturing process of the light detection device according to the present embodiment.

Next, the semiconductor substrate 1N is thinned from the principal surface 1Nb side (cf. FIG. 9). An applicable method for thinning the semiconductor substrate 1N is a mechanical polishing process or a chemical polishing process.

Figure 10:
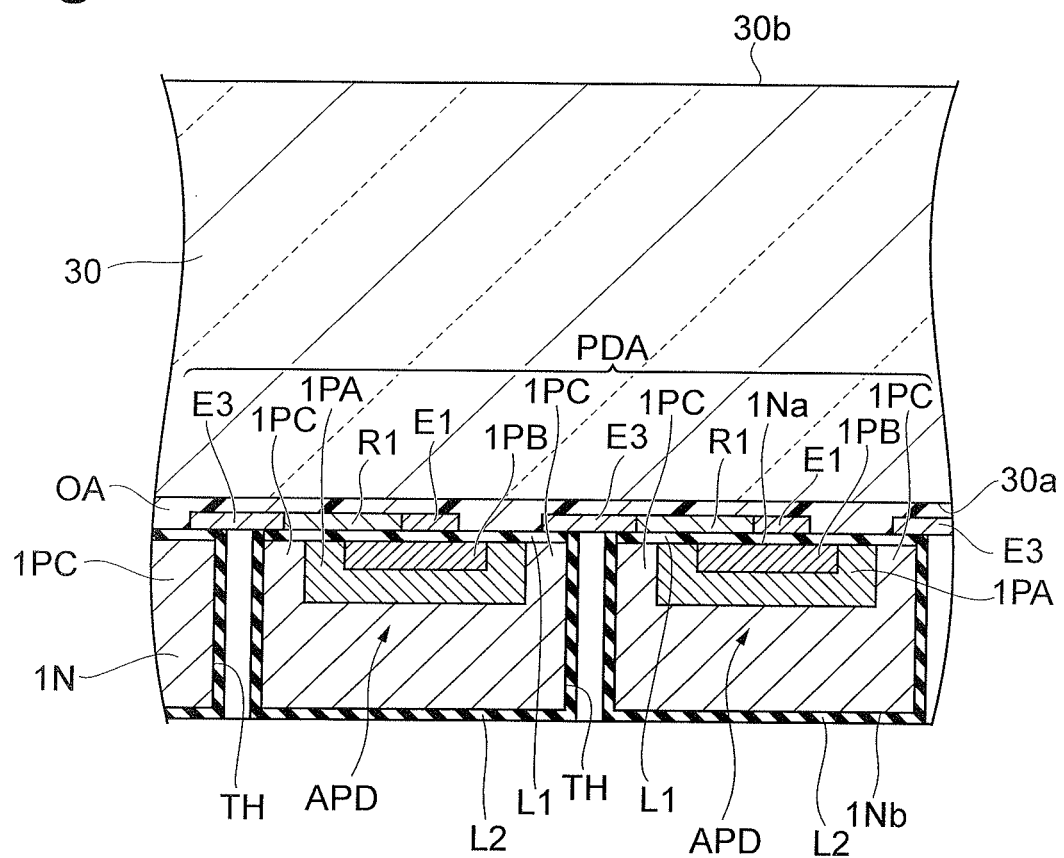
FIG. 10 is a drawing for explaining the manufacturing process of the light detection device according to the present embodiment.

Next, the through holes TH for arranging the through-hole electrodes TE are formed on the semiconductor substrate 1N (cf. FIG. 10). An applicable method for forming the through holes TH is one suitably selected from a dry etching process and a wet etching process.

Figure 11:
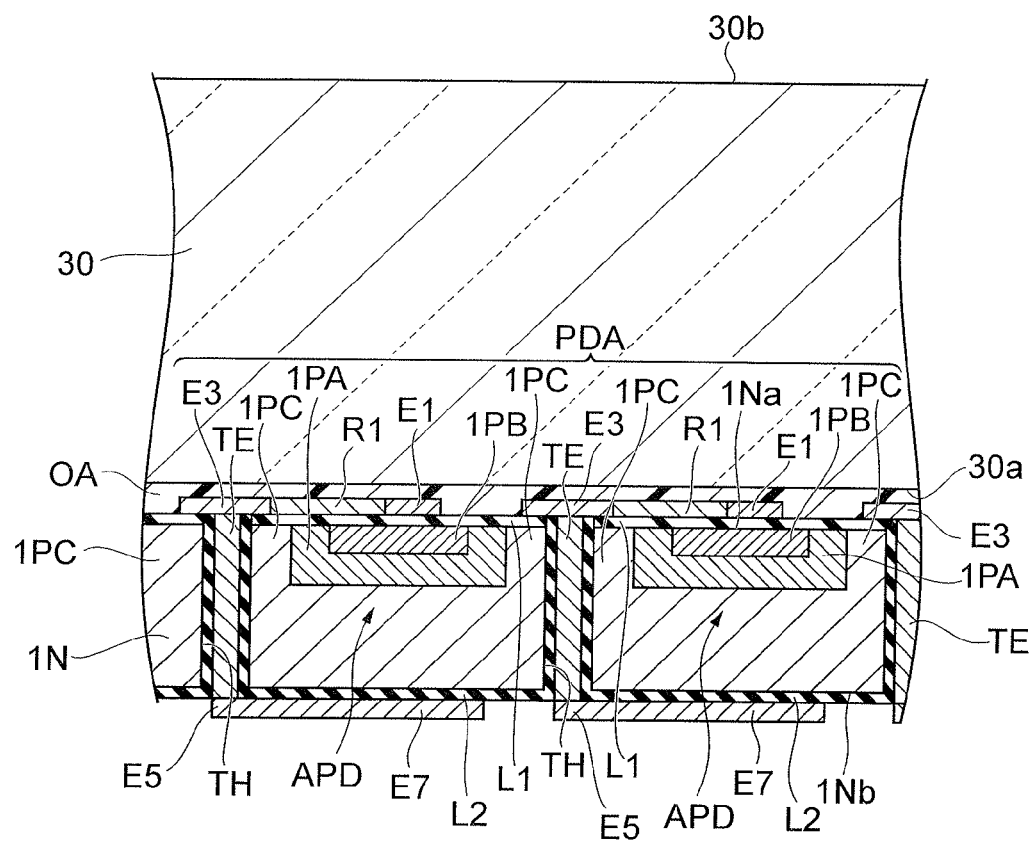
FIG. 11 is a drawing for explaining the manufacturing process of the light detection device according to the present embodiment.

Next, portions corresponding to the photodiode array PDA (through-hole electrodes TE, electrodes E5, and electrodes E7) are formed on the semiconductor substrate 1N in which the through-hole electrodes TH have been formed (cf. FIG. 11).

Figure 12:
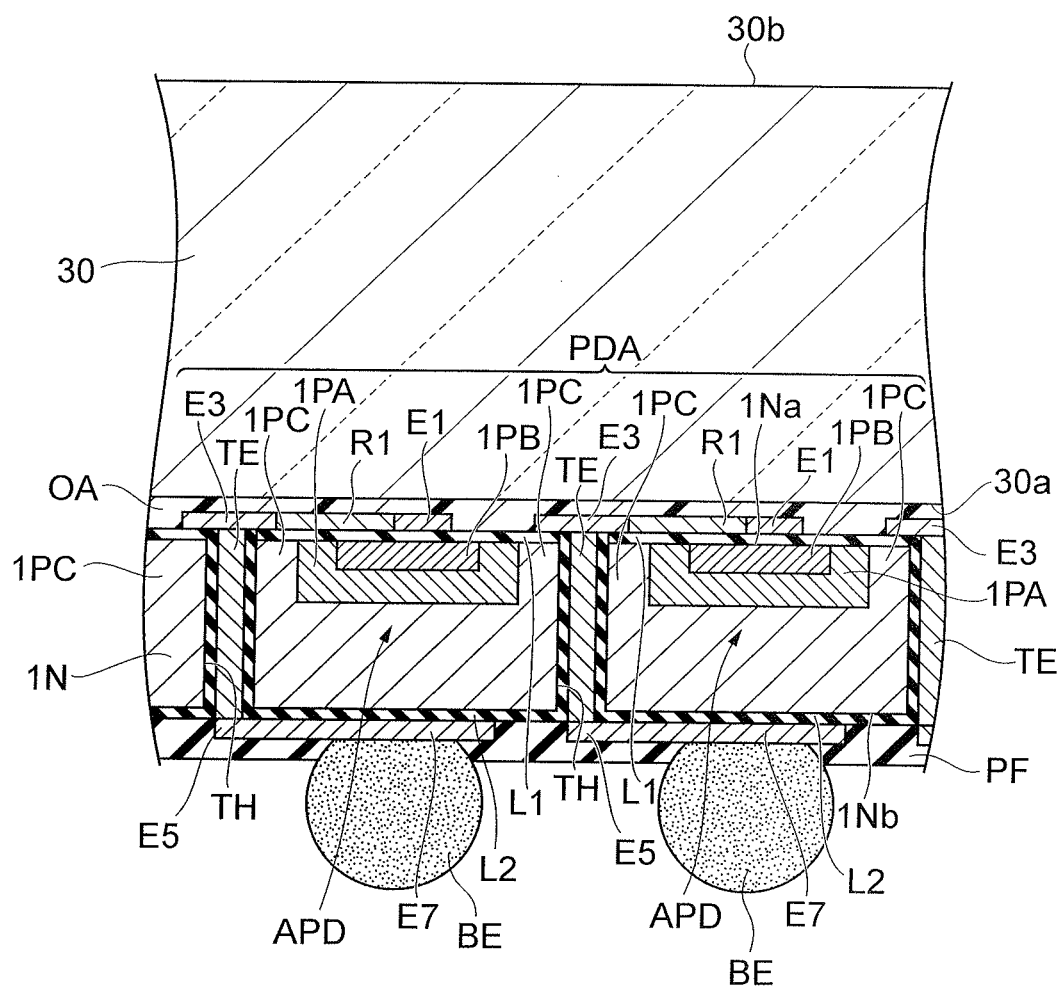
FIG. 12 is a drawing for explaining the manufacturing process of the light detection device according to the present embodiment.

Next, the passivation film PF with the openings formed at the positions corresponding to the bump electrodes BE is formed on the principal surface 1Nb side of the semiconductor substrate 1N, and then the bump electrodes BE are formed (cf. FIG. 12). This process completes a configuration wherein the semiconductor light detection element 10 and the glass substrate 30 are arranged as opposed. Prior to the formation of the bump electrodes BE, UBM (Under Bump Metal) is formed in regions exposed from the passivation film PF on the electrodes E7. The UBM is comprised of a material that achieves superior electrical and physical connection with the bump electrodes BE. An applicable method for forming the UBM is an electroless plating process. An applicable method for forming the bump electrodes BE is a technique for mounting solder balls or a printing process.

Next, the semiconductor light detection element 10 with the glass substrate 30 arranged thereon and the mounting substrate 20 prepared separately are bump-connected to each other (cf. FIG. 13). This process results in obtaining a configuration wherein the mounting substrate 20 is arranged as opposed to the semiconductor light detection element 10 to which the glass substrate 30 is arranged as opposed. In the mounting substrate 20, the bump electrodes BE are formed at the positions corresponding to the electrodes E9 on the principal surface 20a side. The mounting substrate 20 is also prepared in the form of a semiconductor wafer wherein a plurality of mounting substrates 20 are formed.

Next, a laminate body consisting of the glass substrates 30 (glass substrate preform), the semiconductor light detection elements 10 (semiconductor wafer), and the mounting substrates 20 (semiconductor wafer) is cut by dicing. This makes the side surfaces 1Nc of the semiconductor substrate 1N, the side surfaces 20c of the mounting substrate 20, and the side surfaces 30c of the glass substrate 30 flush with each other. The individual light detection devices 1 are obtained through these processes.

In the present embodiment, as described above, the through-hole electrodes TE electrically connected to the quenching resistors R1 and penetrating the semiconductor substrate 1N from the principal surface 1Na side to the principal surface 1Nb side are formed in the semiconductor substrate 1N of the semiconductor light detection element 10 (photodiode array PDA). The through-hole electrodes TE of the semiconductor light detection element 10 and the electrodes E9 of the mounting substrate 20 are electrically connected through the bump electrodes BE. This configuration allows the interconnection distances from the respective pixels (avalanche photodiodes APD) to be set extremely short, and allows values thereof to be equalized without significant variation. Therefore, it remarkably suppresses the influence of resistances and capacitances of the interconnections from the respective pixels and thus achieves further improvement in temporal resolution.

In the present embodiment, the glass substrate 30 arranged as opposed to the semiconductor light detection element 10 enhances the mechanical strength of the semiconductor substrate 1N. Particularly, it is extremely effective in the case where the semiconductor substrate 1N is thinned.

The side surfaces 1Nc of the semiconductor substrate 1N and the side surfaces 30c of the glass substrate 30 are flush with each other. This configuration reduces dead space. The side surfaces 1Nc of the semiconductor substrate 1N and the side surfaces 20c of the mounting substrate 20 are also flush with each other. This configuration further reduces dead space.

The principal surface 30b of the glass substrate 30 is flat. This configuration makes it extremely easy to perform the installation of the scintillator onto the glass substrate 30.

In the present embodiment, the through-hole electrodes TE are located in the regions among the avalanche photodiodes APD. This configuration prevents reduction in fill factor in each pixel.

The semiconductor light detection element 10 includes the electrodes E7 electrically connected to the corresponding through-hole electrodes TE and arranged on the principal surface 1Nb side of the semiconductor substrate 1N and, the electrodes E7 and the electrodes E9 are connected through the bump electrodes BE. This configuration allows the connection between the electrodes E7 and the electrodes E9 through the bump electrodes BE to be implemented with certainty.

Each avalanche photodiode APD has the semiconductor substrate 1N, the first semiconductor region 1PA, the second semiconductor region 1PB, and the electrode E1 electrically connecting the second semiconductor region 1PB and the quenching resistor R1, and the electrode E7 is formed on the region corresponding to the second semiconductor region 1PB on the principal surface 1Nb. This configuration allows us to set the size of the electrode E7 relatively large. As a consequence of this, it is feasible to more certainly implement the connection between the electrode E7 and the electrode E9 through the bump electrode BE and to enhance the mechanical strength of the connection.

The above described the preferred embodiment of the present invention, and it should be noted that the present invention is by no means limited to the aforementioned embodiment and can be modified in many ways without departing from the scope and spirit of the invention.

Figure 14:
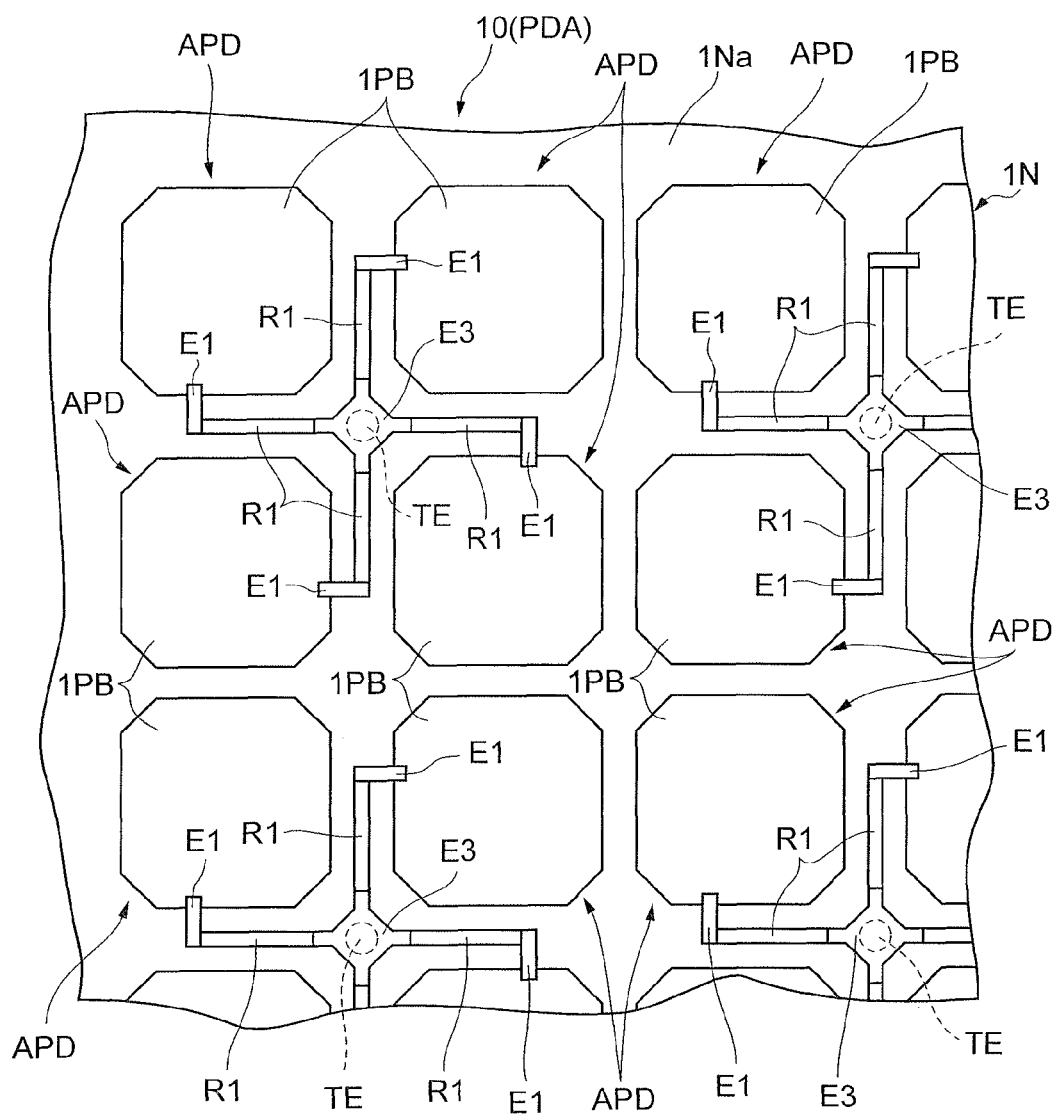
FIG. 14 is a schematic plan view of a semiconductor light detection element.

One quenching resistor R1 is electrically connected to one through-hole electrode TE, but they do not always have to be limited to this configuration. As shown in FIG. 14, a plurality of quenching resistors (e.g., four quenching resistors) 1R may be electrically connected to one through-hole electrode TE. In this case, the through-hole electrode TE is shared among pixels, which decreases the number of through-hole electrodes TE formed in the semiconductor substrate 1N. This configuration suppresses reduction in mechanical strength of the semiconductor substrate 1N. The number of quenching resistors electrically connected to one through-hole electrode TE does not have to be limited to "4" but may be "3" or less, or may be "5" or more.

When a plurality of quenching resistors R1 are electrically connected to one through-hole electrode TE, the interconnection distances from the respective avalanche photodiodes APD through the quenching resistors R1 to the through-hole electrode TE are preferably equal. In this case, the reduction in temporal resolution is also prevented in the configuration wherein the through-hole electrode TE is shared among pixels.

The shapes of the first and second semiconductor regions 1PA, 1PB do not have to be limited to the aforementioned shapes but may be other shapes (e.g., a circular shape or the like). The number (the number of rows and the number of columns) and arrangement of the avalanche photodiodes APD (second semiconductor regions 1PB) do not have to be limited to those described above.

INDUSTRIAL APPLICABILITY

The present invention is applicable to the light detection devices for detecting weak light.

REFERENCE SIGNS LIST 1 light detection device; 1N semiconductor substrate; 1Na, 1Nb principal surfaces; 1Nc side surface; 1PA first semiconductor region; 1PB second semiconductor region; 10 semiconductor light detection element; 20 mounting substrate; 20a, 20b principal surfaces; 20c side surface; 30 glass substrate; 30a, 30b principal surfaces; 30c side surface; APD avalanche photodiode; BE bump electrode; E1, E3, E5, E7, E9 electrodes; PDA photodiode array; R1 quenching resistor; SP signal processing unit; TE through-hole electrode.

The invention claimed is:

1. A light detection device comprising:
a semiconductor light detection element having a semiconductor substrate including first and second principal surfaces opposed to each other;
a mounting substrate arranged as opposed to the semiconductor light detection element and having a third principal surface opposed to the second principal surface of the semiconductor substrate; and
a light-transmissive substrate arranged as opposed to the semiconductor light detection element and having a fourth principal surface opposed to the first principal surface of the semiconductor substrate,
wherein the semiconductor light detection element includes a plurality of avalanche photodiodes operating in Geiger mode and formed in the semiconductor substrate, quenching resistors connected in series to the respective avalanche photodiodes and arranged on the first principal surface side of the semiconductor substrate, and a through-hole electrode electrically connected to the quenching resistors and penetrating the semiconductor substrate,
wherein the mounting substrate includes a first electrode arranged on the third principal surface side and electrically connected to the through-hole electrode, and
wherein a side surface of the semiconductor substrate and a side surface of the light-transmissive substrate are flush with each other.

2. The light detection device according to claim 1, wherein a principal surface of the light-transmissive substrate opposed to the fourth principal surface is flat.

3. The light detection device according to claim 1, wherein the through-hole electrode is located in a region among the avalanche photodiodes.

4. The light detection device according to claim 1, wherein the semiconductor light detection element further includes a second electrode electrically connected to the through-hole electrode and arranged on the second principal surface side of the semiconductor substrate, and
wherein the first electrode and the second electrode are connected through a bump electrode.

5. The light detection device according to claim 4, wherein each of the avalanche photodiodes has:
the semiconductor substrate of a first conductivity type;
a first semiconductor region of a second conductivity type formed on the first principal surface side of the semiconductor substrate;
a second semiconductor region of the second conductivity type formed in the first semiconductor region and having a higher impurity concentration than the first semiconductor region; and
a third electrode arranged on the first principal surface side of the semiconductor substrate and electrically connecting the second semiconductor region and the quenching resistor, and
wherein the second electrode is formed on a region corresponding to the second semiconductor region on the second principal surface.

6. The light detection device according to claim 1, wherein interconnection distances from the respective avalanche photodiodes through the corresponding quenching resistors to the through-hole electrode are equal.

* * * * *